US009023675B2

(12) United States Patent
Nicolas

(10) Patent No.: US 9,023,675 B2
(45) Date of Patent: May 5, 2015

(54) PROCESS FOR ENCAPSULATING A MICROELECTRONIC DEVICE COMPRISING INJECTION OF NOBLE GAS THROUGH A MATERIAL PERMEABLE TO THIS NOBLE GAS

(71) Applicant: Commissariat a l'Energie Atomique et aux Ene Alt, Paris (FR)

(72) Inventor: Stephane Nicolas, Meylan (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/264,624

(22) Filed: Apr. 29, 2014

(65) Prior Publication Data

US 2014/0342487 A1    Nov. 20, 2014

(30) Foreign Application Priority Data

May 15, 2013    (FR) ...................................... 13 54349

(51) Int. Cl.
| H01L 21/00 | (2006.01) |
| B81C 1/00 | (2006.01) |
| H01L 23/10 | (2006.01) |
| H01L 21/50 | (2006.01) |
| H01L 21/52 | (2006.01) |
| H01L 21/54 | (2006.01) |
| H01L 23/28 | (2006.01) |

(52) U.S. Cl.
CPC ......... *B81C 1/00285* (2013.01); *B81C 1/00293* (2013.01); *H01L 23/10* (2013.01); *H01L 21/50* (2013.01); *H01L 21/52* (2013.01); *H01L 21/54* (2013.01); *B81B 2201/0235* (2013.01); *B81B 2201/0242* (2013.01); *B81C 2203/0118* (2013.01); *B81C 1/00777* (2013.01); *B81C 2203/0145* (2013.01); *H01L 23/28* (2013.01)

(58) Field of Classification Search
None
See application file for complete search history.

(56) References Cited

U.S. PATENT DOCUMENTS

| 7,932,568 B2 | 4/2011 | Kuisma et al. |
| 8,124,435 B2 | 2/2012 | Kuisma et al. |

(Continued)

FOREIGN PATENT DOCUMENTS

| EP | 2 362 182 A2 | 8/2011 |
| FR | 2 841 380 A1 | 12/2003 |

OTHER PUBLICATIONS

French Preliminary Search Report issued Nov. 29, 2013, in French Application No. 13 54349 filed May 15, 2013 (with English Translation of Categories of Cited Documents).
U.S. Appl. No. 14/198,947, filed Mar. 6, 2014, Nicolas.

*Primary Examiner* — Kyoung Lee
(74) *Attorney, Agent, or Firm* — Oblon, McClelland, Maier & Neustadt, L.L.P.

(57) ABSTRACT

A process for encapsulating a microelectronic device, comprising the following steps:
  make the microelectronic device on a first substrate;
  make one portion of a first material not permeable to the ambient atmosphere and permeable to a noble gas in a second substrate comprising a second material not permeable to the ambient atmosphere and the noble gas;
  secure the second substrate to the first substrate, forming at least one cavity inside which the microelectronic device is encapsulated such that said portion of the first material forms part of a wall of the cavity;
  inject the noble gas into the cavity through the portion of the first material;
  hermetically seal the cavity towards the ambient atmosphere and the noble gas.

18 Claims, 5 Drawing Sheets

(56) References Cited

U.S. PATENT DOCUMENTS

| | | |
|---|---|---|
| 8,350,346 B1 | 1/2013 | Huang et al. |
| 2007/0259470 A1 * | 11/2007 | Quenzer et al. ................ 438/50 |
| 2014/0038364 A1 | 2/2014 | Nicolas et al. |

* cited by examiner

PROCESS FOR ENCAPSULATING A MICROELECTRONIC DEVICE COMPRISING INJECTION OF NOBLE GAS THROUGH A MATERIAL PERMEABLE TO THIS NOBLE GAS

TECHNICAL FIELD AND PRIOR ART

The invention relates to the field of microelectronics and more particularly packaging or encapsulation of a microelectronic device such as a MEMS (Micro-Electro-Mechanical Systems), NEMS (Nano-Electro-Mechanical Systems), MOEMS (Micro-Opto-Electro-Mechanical Systems), or NOEMS (Nano-Opto-Electro-Mechanical Systems) microsystem consisting of encapsulating or enclosing this device in a hermetically sealed cavity in which the atmosphere is controlled. The encapsulation process according to the invention is advantageously used to make collective encapsulation of several microelectronic devices in distinct cavities in which a noble gas is enclosed at different pressures.

Encapsulation of a microelectronic device firstly provides it with protection towards external elements (humidity, particulate pollution, reactive elements such as oxygen or other non neutral gases), and secondly controls the atmosphere (pressure, composition of the encapsulated gas, etc.) in the cavity in which this device is encapsulated. The encapsulation pressure in this cavity is variable depending on the envisaged application and is typically between 1 bar and $10^{-3}$ mbars.

Therefore a recurrent constraint in the field of packaging of this type of device is to achieve very precise control over the pressure in the cavity in which the device is encapsulated. For example, for a gyroscope type MEMS device, the device usually has to be encapsulated in a high vacuum environment (for example at a pressure between about $10^{-1}$ and $10^{-3}$ mbars) otherwise this type of device will not function correctly. An RF (Radio Frequency) switch type MEMS device has to be encapsulated at a pressure close to atmospheric pressure but in a "neutral" gas environment, for example to avoid oxidation of switch contact zones. In this case, the switch has to be encapsulated in an $N_2$, Ar, or He type gas environment.

This type of device is usually packaged at the scale of the substrate in order to collectively encapsulate several microelectronic devices made on the same substrate, in order to reduce fabrication costs of these devices. In particular, such packaging may be done by hermetically sealing a cap substrate on a first substrate containing the devices. There are different sealing techniques for obtaining a hermetically sealed assembly of the cap substrate with the first substrate, for example such as molecular bonding (or direct bonding), metallic bonding, anodic bonding and glass frit bonding. In the case of molecular or anodic bonding, the two substrates are bonded to each other directly, while in the case of metallic bonding or glass frit bonding, there is a sealing joint between the two substrates to make the encapsulation structure cohesive.

The main parameters to be taken into account for controlling the pressure in an encapsulation cavity are:
the hermetic seal of the sealing joint between the substrates, if there is one;
permeation of gases through walls of the cavity formed by the substrates and/or the sealing joint;
degassing of the different materials present in the cavity.

If a vacuum is required in the cavity (for example at a pressure of less than about 1 mbar), a getter material usually has to be deposited inside the cavity. This getter material may comprise one or several thin metallic layers (typically zirconium or titanium) for example deposited by Physical Vapor Deposition (PVD).

There are particular components each comprising a triaxial accelerometer, a triaxial gyroscope and a triaxial magnetometer, thus forming an inertial sensor with 9 detection axes. With this type of component, triaxial microelectronic devices (accelerometer, gyroscope and magnetometer) are usually made independently of each other and then assembled during final packaging of the component, which in this case is a non-collective encapsulation process.

Integration of different microelectronic devices of the component on the same substrate is envisaged in order to reduce manufacturing costs of this type of component. However, this type of integration causes problems.

An accelerometer usually operates at a fairly high (more than about 1 mbar) residual pressure (pressure inside the encapsulation cavity) to be sufficiently dampened, while a gyroscope usually requires the lowest possible residual pressure (for example between about $10^{-1}$ and $10^{-4}$ mbars) in order to operate optimally. It is very difficult to package and therefore hermetically seal cavities with very different residual pressures on the same substrate.

A first solution might be to seal the accelerometer and gyroscope cavities at very low pressure (for example between about $10^{-3}$ and $10^{-5}$ mbars), and to place a getter material in the gyroscope cavity but not in the accelerometer cavity. The getter material will be capable of maintaining a very low residual pressure in the gyroscope cavity (less than about $10^{-1}$ mbars) by adsorbing gases released by the different materials present in the cavity during bonding.

This first solution works but it is incapable of achieving high pressure differences between the two cavities: typically the residual pressure in the accelerometer cavity will be between a few mbars and a few tens of mbars due to degassing of the different materials contained in the accelerometer cavity during bonding. In some cases, for the accelerometer, a residual pressure of more than about 100 mbars or approximately equal to 1 bar (strong damping) is necessary. In this case, the solution described above cannot function.

A second solution might consist of bonding the two cavities at atmospheric pressure (for example at a pressure of about 1 bar), and to put a getter material in the gyroscope cavity.

However, due to the limited pumping capacity and the limited size of the getter material (the maximum size of which is limited by the cavity dimensions), in this case it will be impossible to drop below a residual pressure of about 1 mbar in the gyroscope cavity because the getter will be saturated before such pressure is reached.

Regardless of which solution is chosen (bonding at low pressure or at atmospheric pressure), one of the two devices is not encapsulated with a residual pressure corresponding to its residual pressure range necessary for optimum functioning.

Document U.S. Pat. No. 8,350,346 B1 discloses a component with different volume cavities inside which a gyroscope and an accelerometer are encapsulated. The volume of the cavity inside which the accelerometer is encapsulated is less than the volume of the cavity inside which the gyroscope is encapsulated. Thus, the pressure after packaging in the accelerometer cavity is higher than the pressure in the gyroscope cavity. However, such a structure is incapable of obtaining pressure differences varying from 1 bar to $10^{-3}$ mbars in the different cavities.

PRESENTATION OF THE INVENTION

Thus there is a need to propose a process for encapsulating a microelectronic device to precisely control the atmosphere, i.e. the pressure and gas composition, in which the microelectronic device is encapsulated, that can also be used for encapsulating devices in different cavities in which the residual pressures of at least one noble gas are different, when it is used for a collective encapsulation of several microelectronic devices.

To achieve this, this description discloses a process for encapsulating at least one microelectronic device, comprising at least the following steps:

make the microelectronic device on a first substrate;

make at least one portion of a first material not permeable to the ambient atmosphere and permeable to at least one noble gas in a second substrate not permeable to the ambient atmosphere and to the noble gas, said portion of the first material extending from a first face of the second substrate as far as another face of the second substrate opposite the first face;

secure the second substrate to the first substrate, forming at least one cavity inside which the microelectronic device is encapsulated such that said portion of the first material forms at least part of a wall of the cavity;

inject the noble gas into the cavity through the portion of the first material;

hermetically seal the cavity towards the ambient atmosphere and the noble gas.

The term "noble gas" as used in the following refers to one or several noble gases, or rare or chemically inert gases, corresponding to the chemical elements in group 18 in the periodic table of the elements, in other words helium and/or neon and/or argon and/or krypton and/or xenon and/or radon. Furthermore, the term "microelectronic device" refers to any type of device in the electronics field with micrometric or nanometric dimensions, and for example of the MEMS, NEMS, MOEMS or NOEMS type.

The ambient atmosphere may be air or a controlled atmosphere (for example a gas mix) surrounding the structure encapsulating the microelectronic device. The gas(es) of the ambient atmosphere is (are) different from said noble gas.

This process uses the property of the first material that it is permeable only to one or several noble gases, and not permeable or non porous towards the ambient atmosphere.

Since the noble gas is injected in the cavity after the second substrate, which forms a cap substrate, has been secured to the first substrate, the quantity of noble gas injected through the portion of the first material can be controlled precisely particularly through the choice of dimensions of this portion of the first material in the plane of the second substrate. In particular, this process is capable of obtaining a residual pressure of the noble gas in the cavity varying from about $10^{-1}$ mbars to about 1 bar, or even a pressure higher than 1 bar.

This process also has the advantage that it can be used with standard fabrication techniques in the microelectronics field (MEMS fabrication, bonding, etc.).

The second substrate may correspond to a single layer of material or it may comprise several layers of material.

Production of the portion of the first material may include the following steps:

produce at least one opening or hole in a part of the thickness of the second substrate through the first face of the second substrate;

make the portion of the first material in the opening;

eliminate part of the second substrate from a second face of the second substrate opposite the first face, exposing or revealing the portion of the first material and forming said other face of the second substrate.

The first material may include glass or semiconducting oxide.

The first material may include glass and the making of the portion of the first material in the opening may include the following steps:

secure a third glass substrate in contact with the first face of the second substrate and facing the opening;

remelt the glass of at least part of the third substrate in the opening, forming the portion of the first material in the opening.

After the glass remelting step, the process may comprise a step to eliminate the glass of the third substrate located outside the opening.

The second substrate may include a semiconductor, and the step to produce the opening may include etching in said part of the thickness of the second substrate such that remaining portions of the semiconductor of the second substrate remain in the opening, the making of the portion of the first material in the opening may include oxidation of said remaining portions of the semiconductor.

The second substrate may include a semiconductor, and the making of the portion of the first material may include the following steps:

produce porosities or pores in part of the thickness of the second substrate, through the first face of the second substrate;

oxidise the porous part of the second substrate forming the portion of the first material;

eliminate part of the second substrate from a second face of the second substrate opposite the first face, exposing the portion of the first material and forming said other face of the second substrate.

The process may also include a step to eliminate the semiconductor oxide located outside the opening, after the oxidation step and when the oxidation applied forms the semiconductor oxide outside the opening.

Hermetic sealing of the cavity towards the ambient atmosphere and the noble gas may include the deposition of at least one second material not permeable to the noble gas at least in contact with said portion of the first material, at the first face of the second substrate.

The steps which are carried out may include encapsulation of at least two microelectronic devices in at least two distinct cavities formed between the first substrate and second substrate, such that at least one portion of the first material forms at least part of a wall of one of the cavities. Thus, it is possible to collectively integrate and encapsulate different types of microelectronic devices capable of operating at different residual pressures, for example such as an accelerometer and a gyroscope.

The steps which are carried out may make at least two portions of the first material each forming at least part of a wall of one of the two cavities.

Said at least two portions of the first material may have different dimensions at the first face of the second substrate and/or the other face of the second substrate, that is at at least one of the first face of the second substrate and the other face of the second substrate. Thus, these dimensions of the portions of the first material may be chosen as a function of the quantity of noble gas intended to be injected into each of the cavities.

At least one of the microelectronic devices may be encapsulated in one of the cavities such that no wall of said one of the cavities is permeable to the noble gas. The steps which are carried out may include encapsulation of at least a third microelectronic device in a third cavity formed between the first substrate and the second substrate, and such that no wall of said third cavity is permeable to the noble gas.

The process may also include production of at least one portion of getter material in one or several of the cavities, before the step in which the second substrate is secured to the first substrate. The getter material can adsorb residual reactive gases, for example such as oxygen or hydrogen. Only the noble gas(es) that are non reactive are then present in the cavity(ies) containing the getter material. Depending on the target application, this or these cavities may or may not include portions of the first material, the getter materials then being located outside said portions of the first material.

The microelectronic device encapsulated in the cavity of which no wall is permeable to the noble gas may be a gyroscope, and at least the other of the microelectronic devices may be an accelerometer.

The noble gas may include helium and/or argon and/or neon, and/or the step to inject a noble gas into the cavity through the portion of the first material may be carried out by exposing at least the first face of the second substrate to the noble gas at a pressure of between about 1 bar and 6 bars.

The noble gas may include at least one of helium, argon and neon. The step to inject a noble gas into the cavity through the portion of the first material may be carried out by exposing at least the first face of the second substrate to the noble gas at a pressure of between about 1 bar and 6 bars.

The process is advantageously used for a noble gas containing neon and/or helium and/or argon, particularly due to the small dimensions of the molecules of these gases facilitating the passage of this or these gas(es) through the portions of the first material.

BRIEF DESCRIPTION OF THE DRAWINGS

This invention will be better understood after reading the description of example embodiments given purely for guidance and in no way limitative, with reference to the appended drawings in which.

Identical, similar or equivalent parts of the different figures described below have the same numeric references to facilitate comparison between different figures.

The different parts shown in the figures are not necessarily all at the same scale, to make the figures more easily readable.

The different possibilities (variants and embodiments) should be understood as being not exclusive of each other and can be combined with each other.

DETAILED PRESENTATION OF PARTICULAR EMBODIMENTS

Refer firstly to FIGS. 1 to 4 that represent the steps of a process for encapsulating a microelectronic device in a gaseous atmosphere comprising at least one noble gas. In the particular embodiment disclosed with reference to these figures, the process which is carried out corresponds to manufacturing of a component or chip 100 of the inertial control unit type, during which a collective encapsulation of several microelectronic devices made on the same first substrate and designed to be encapsulated in different cavities at different atmospheres is made.

Figure 1:
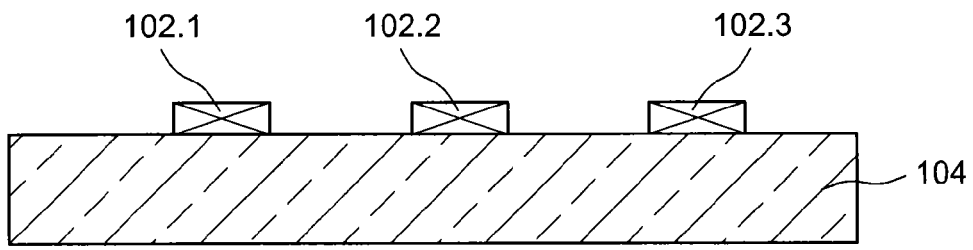
FIGS. 1 to 4 show steps in an encapsulation process according to a particular embodiment.

As show in FIG. 1, three microelectronic devices 102.1 to 102.3 are made on a first substrate 104 or wafer (the thickness of which is more than about 100 µm) for example comprising a monolithic semiconducting substrate such as silicon. In this particular embodiment, the first device 102.1 is for example an accelerometer intended to be strongly dampened and therefore intended to be encapsulated at a high residual pressure. The second device 102.2 is for example another accelerometer intended to be slightly dampened and therefore intended to be encapsulated at a lower residual pressure than the pressure with which the first device 102.1 is encapsulated. The third device 102.3 is for example a gyroscope. The material of the first substrate 104 in this case is not permeable to the ambient atmosphere, for example is not permeable to air, and is not permeable to the noble gas with which one or several of the devices 102.1 to 102.3 are intended to be encapsulated.

We will now describe production of a cap substrate 106 intended to be secured to the first substrate 104 (and thus encapsulate microelectronic devices 102.1 to 102.3) with reference to FIGS. 2A to 2F.

Figure 2A:
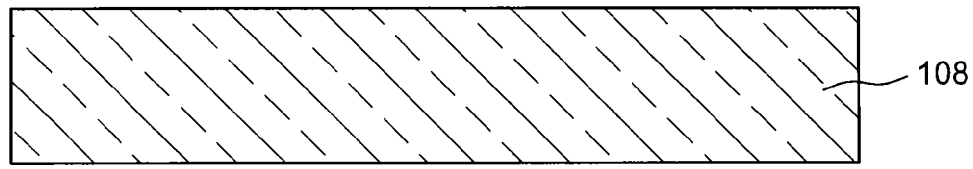
Figure 2B:
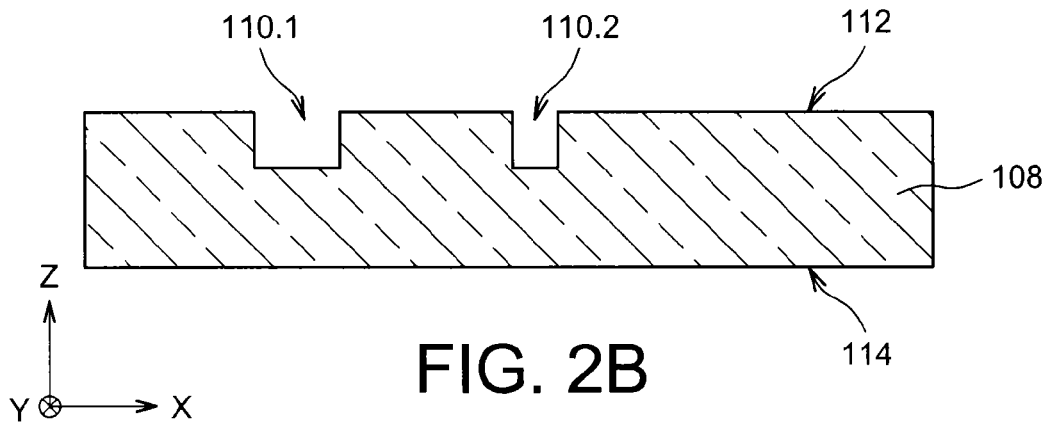
Figure 2C:
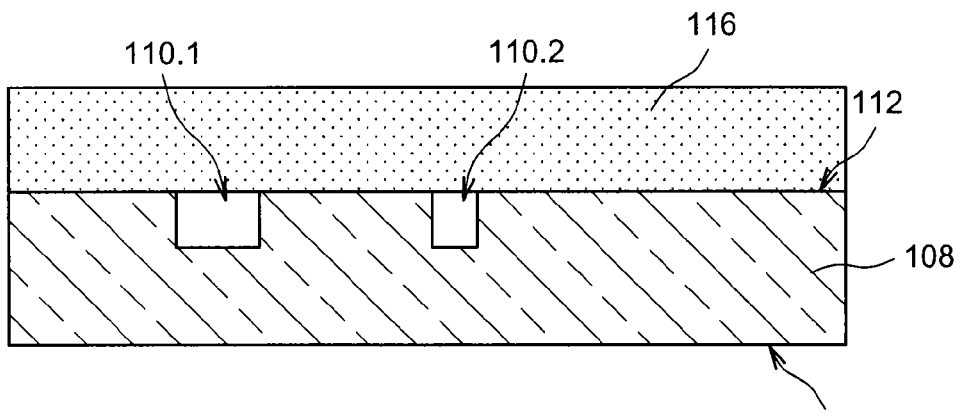

To achieve this, a second substrate 108 or wafer is used (FIG. 2A). This second substrate 108 comprises a material not permeable to the ambient atmosphere and not permeable to the noble gas. For example, the second substrate 108 comprises a semiconductor such as silicon.

Openings 110 are then made, for example by etching, through part of the thickness of the second substrate 108, for example with a depth of between about 10 µm and 500 µm. These openings form locations inside which portions of material not permeable to ambient atmosphere but permeable to the noble gas, called portions of a first material, are intended to be made. In the embodiment disclosed herein, since only devices 102.1 and 102.2 are intended to be encapsulated in atmospheres comprising this noble gas, only two openings 110.1 and 110.2 are made in the second substrate 108. Furthermore, these openings 110.1 and 110.2 are made such that the portions of the first material intended to be made in these openings form at least part of a wall (upper wall in this case) of each of the cavities in which the two devices 102.1 and 102.2 are intended to be encapsulated, when the cap substrate 106 is secured to the first substrate 104.

Openings 110 are made through a first face 112 of the second substrate 108. The second substrate 108 comprises a second face 114 opposite the first face 112 and intended to be arranged facing the first substrate 104 during securing of the two substrates 104 and 108. The dimensions of each opening 110 in an (X, Y) plane parallel to the first face 112 correspond approximately to the required dimensions of the portions of the first material intended to be made in these openings, these dimensions being chosen as a function of the quantity of noble gas that will be subsequently injected into the cavities through these portions of the first material. These dimensions (in the (X, Y) plane) are for example between a few microns and a few millimetres, for example between about 2 µm and 10 mm.

A next step is to make portions of the first material in the openings 110.

This is done by securing a third glass substrate 116 in contact with the first face 112 of the second substrate 108. For example, this securing is done by anodic bonding between the third substrate 116 and the second substrate 108. The glass of the third substrate 116 is for example a molten silica type glass or one of its derivatives, for example a borosilicate glass for example of the Pyrex® or borosilicate float (Borofloat 9 type, which is non porous towards the ambient atmosphere.

Figure 2D:
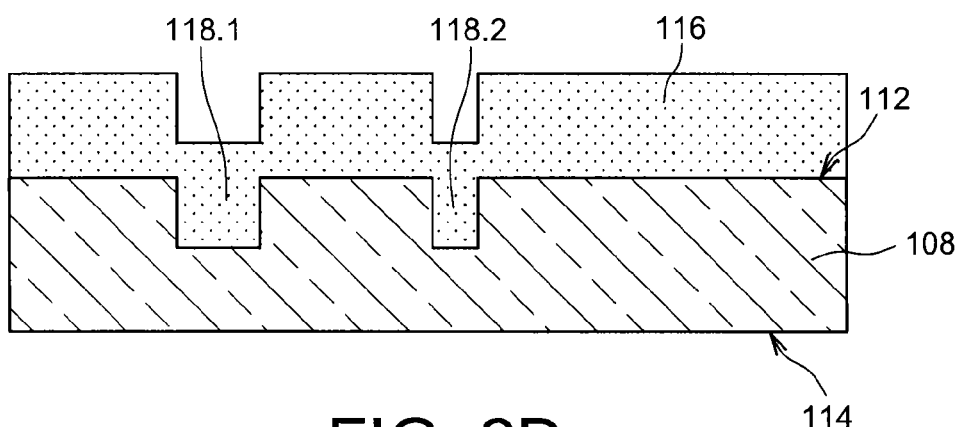

As shown in FIG. 2D, annealing is carried out for example at a temperature of between about 550° C. and 860° C., causing partial remelting of the glass of the third substrate 116 and thus forming portions 118 of the first material that in this case is glass and corresponds to a material not permeable to the ambient atmosphere and permeable to the noble gas in the openings 110 (portions 118.1 and 118.2 respectively being formed in the openings 110.1 and 110.2 in the example disclosed herein).

Figure 2E:
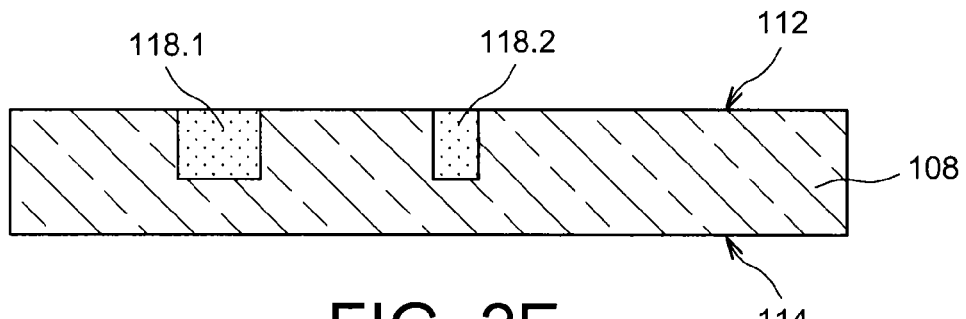

The glass of the third substrate 116 located outside the openings 110 is then eliminated, for example by grinding followed by chemical-mechanical planarization with stop on the first face 112 of the second substrate 108 (FIG. 2E).

Figure 2F:
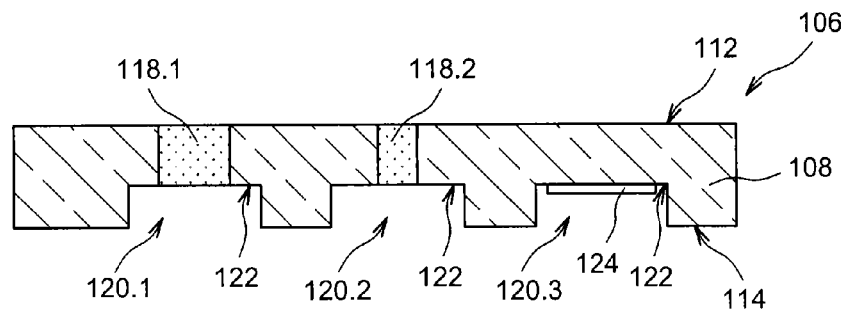

The cap substrate 106 is completed by etching cavities 120 through the second face 114 of the second substrate 108 and on part of the thickness of the second substrate 108, inside which microelectronic devices 102.1 to 102.3 are intended to be encapsulated (FIG. 2F).

This etching is done as far as another face 122 of the second substrate 108 (this other face 122 being located between the two main faces 112 and 114 of the second substrate 108) at which the portions 118 are exposed or accessible. Therefore, the portions 118 are accessible from the first face 112 and from this other face 122 of the second substrate 108. A getter material 124 is arranged in the cavity 120.3 at which no portion 118 was made because a very low residual pressure will be required in this cavity 120.3. In the example disclosed herein, the dimensions of cavities 120.1, 120.2 and 120.3 are the same, but cavities with different dimensions from each other can also be made.

Figure 3:
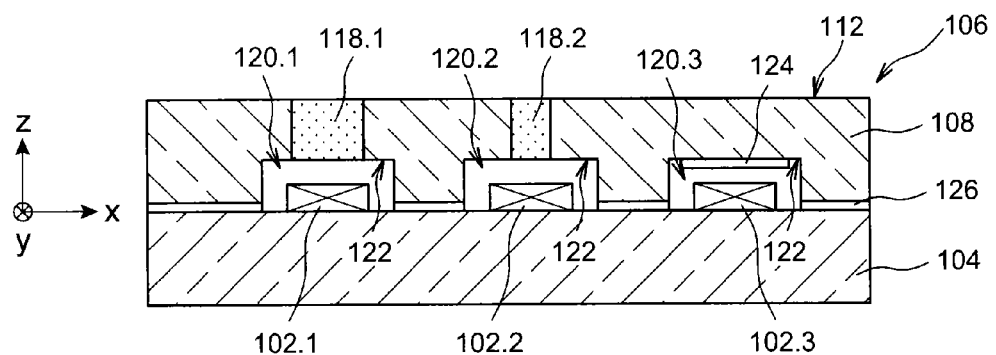

As shown in FIG. 3, the cap substrate 106 obtained is secured to the first substrate 104 for example by metallic, anodic bonding or glass frit bonding, through a sealing joint 126 made between the cap substrate 106 and the first substrate 104. This bonding is done at a high vacuum, for example at a pressure of between about $10^{-3}$ mbars and $10^{-5}$ mbars, or even less than $10^{-5}$ mbars, to flush out all air present between the cap substrate 106 and the first substrate 104 and thus reduce the quantity of residual reactive gases in the cavities. When the first substrate 104 and the second substrate 108 comprise the same material, for example a semiconductor, this securing can be obtained by the use of low temperature molecular bonding (for example carried out at a temperature less than or equal to about 400° C.) between the first substrate 104 and the second substrate 108. In this case, no sealing joint is present between the two substrates 104 and 108.

The assembly obtained is then arranged in a chamber inside which the noble gas under pressure is located and that will be injected into the cavities 120.1 and 120.2. In this case, this noble gas is argon and/or helium, and the pressure used is between about 1 bar and 6 bars. Due to the larger dimensions (in the (X, Y) plane) of the portion 118.1 compared with the dimensions of portion 118.2, the quantity of noble gas injected into the first cavity 120.1 through the portion 118.1 is greater than the quantity of noble gas injected into the second cavity 120.2 through the portion 118.2. No noble gas is injected in the third cavity 120.3 because no portion of the material permeable to the noble gas was made to form part of a wall of this third cavity 120.3.

In general, the quantity of noble gas injected into a cavity 120 depends on the size of the opening formed by the portion 118 that forms at least part of a wall of this cavity 120, in other words the dimensions of this portion 118 in a plane parallel to a principal plane of the substrate in which the portion 118 is made, and also the thickness of the material of portion 118 (the thickness corresponding to the dimension perpendicular to the dimensions of the portion 118 located in said plane parallel to the principal plane of the substrate), the volume of the cavity 120, the pressure of the noble gas to which the portion 118 is exposed, and the duration during which the portion 118 is exposed to the noble gas under pressure. Thus, depending on the pressure (P) of helium, the temperature (T) in the chamber in which the injection is made, the area (S) of the portion 118 through which the noble gas is injected, the thickness (e) of the portion 118, the duration (t) of the injection step and the volume (V) of the cavity 120, a residual pressure $\Delta P$ is obtained in the cavity 120 equal to:

$$\Delta P = K.S.t.P/(e.V)$$

where K is a coefficient that depends on the temperature T and the nature of the material of the portion 118. For example, the $\Delta P$ obtained for a portion 118 composed of glass used in anodic bonding (glass with tradenames "Pyrex" or "Borofloat") for parameters P=1 bar, T=20° C., t=1200 s, S=10 mm², e=0.5 mm, V=0.3 mm³ and injected helium is equal to $10^{-1}$ mbars. With T=100° C., a pressure $\Delta P$ equal to $10^{-1}$ mbars can be obtained with a duration t equal to only 5 seconds (the values of other parameters being the same as the previous values).

Figure 4:
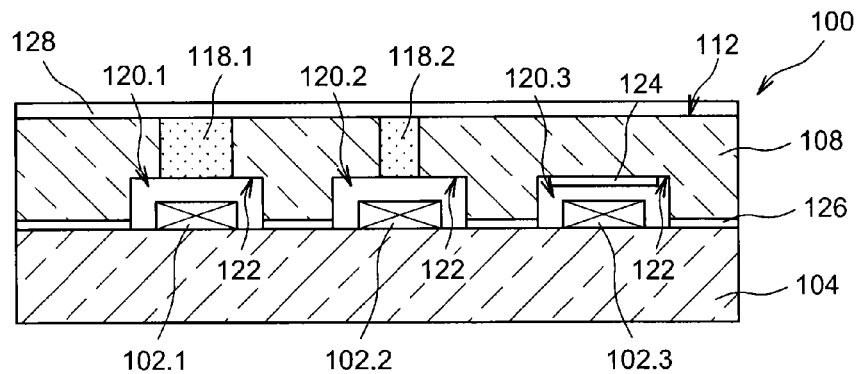

The different cavities 120 are then hermetically sealed by the making of a layer 128 of material not permeable to the ambient atmosphere and to the noble gas on the upper face of the cap substrate 106, for example corresponding to a metallic layer that may comprise titanium and/or aluminium and/or copper and/or zirconium, or a semiconductor layer, with a thickness between about 0.5 and 10 μm, or between 0.5 μm and 2 μm (FIG. 4). The layer 128 may be deposited by PVD deposition.

The encapsulation process can be completed by thermal activation of the getter material 124. The getter material 124 then pumps any non-neutral residual gases present in the cavity 120.3, for example such as oxygen, nitrogen, hydrogen, water, carbon monoxide or carbon dioxide. On the other hand, neutral gases such as the noble gas are not pumped by the getter material because they do not react with the getter material 124 due to the fact that noble gases are not reactive.

This thermal activation of the getter material 124 could also have been made during assembly of the cap substrate 106 with the first substrate 104.

The component 100 comprising the three microelectronic devices 102.1, 102.2 and 102.3 encapsulated is then complete.

In the example described herein, the gyroscope 102.3 is encapsulated in the third cavity 120.3 at a very low residual pressure, for example less than about $10^{-1}$ mbars, and for example between $10^{-3}$ mbars and $10^{-4}$ mbars, because bonding between the cap substrate 106 and the first substrate 104 was done under a high vacuum, and also because no noble gas is injected into the cavity 120.3 and because the getter material 124 also absorbs/adsorbs non-neutral gases once it has been thermally activated. The accelerometer 102.2 is encapsulated in the second cavity 120.2 with a residual noble gas pressure for example between about 10 mbars and 100 mbars. Finally, the accelerometer 102.1 is encapsulated in the first cavity 120.1 with a residual pressure of the noble gas higher than the residual pressure in the second cavity 120.2 considering the larger dimensions of the portion 118.1 than portion 118.2 so that a larger quantity of gas is injected into this cavity 120.1, for example between about 100 mbars and 1 bar.

In the example disclosed above, only three microelectronic devices 102 made on the first substrate 104 are encapsulated. However, a different number, and particularly a larger number of microelectronic devices could be made on the first substrate. The different collectively encapsulated devices forming different components or chips can then be separated from each other by cutting the assembly made. A component may comprise one or several cavities inside which one or several microelectronic devices are encapsulated.

We will now disclose a first variant embodiment of the cap substrate 106 with reference to FIGS. 5A to 5D.

As before, the second substrate 108 is used.

The openings 110 are then made through part of the thickness of the second substrate 108. However, unlike the previous example embodiment in which the openings 110 are made by simple etching, the openings 110 (110.1 and 110.2 in FIG. 5A) in this case are made such that the remaining portions 130 of the material in the second substrate 108 are present in the openings 110. In the example disclosed herein, the etching used is of the DRIE (Deep Reactive Ion Etching) type and forms semiconductor pillars 130 in these openings 110. These remaining portions 130 of material are made such that they can be transformed later to form portions 118 of the first material.

Figure 5A:
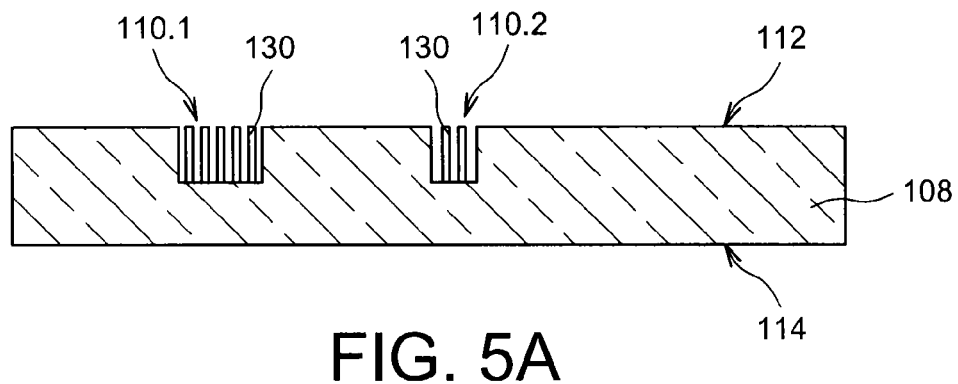
FIGS. 5A-5D and 6A-6B show the steps to produce a cap substrate according to different variant embodiments.
Figure 5B:
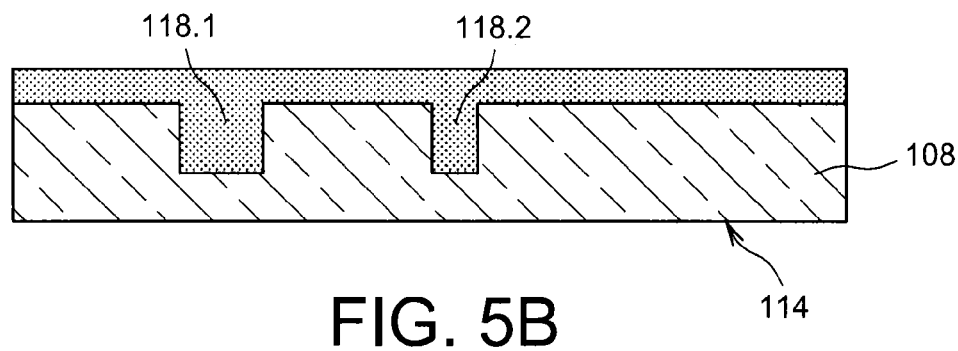

As shown in FIG. 5B, an oxidation step, for example a thermal oxidation, is then applied for example at a temperature of between about 1000° C. and 1200° C. This oxidation step transforms the remaining portions 130 present in the openings 110, thus forming portions 118 of the first material (118.1 and 118.2 in FIG. 5B) containing a semiconductor oxide ($SiO_2$ in this case) that is not permeable to ambient atmosphere but is permeable to the noble gas intended to be injected into the cavities, in the openings 110. This oxidation step also makes the semiconductor oxide on the first face 112 of the second substrate 108. The thickness of the oxide made may be between about 1 μm and 10 μm.

Figure 5C:
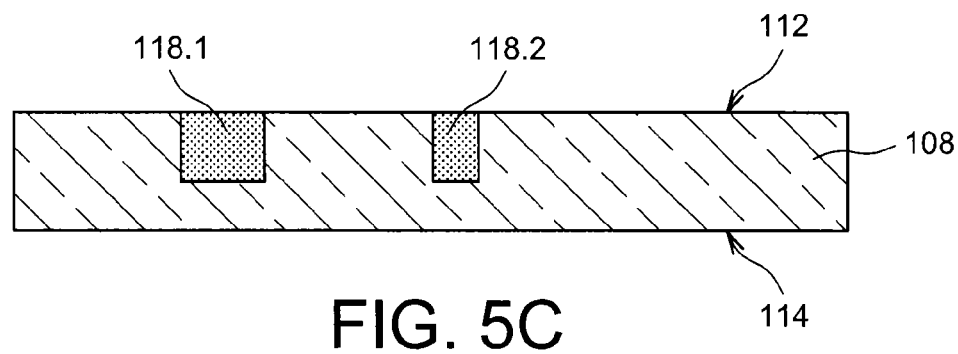
Figure 5D:
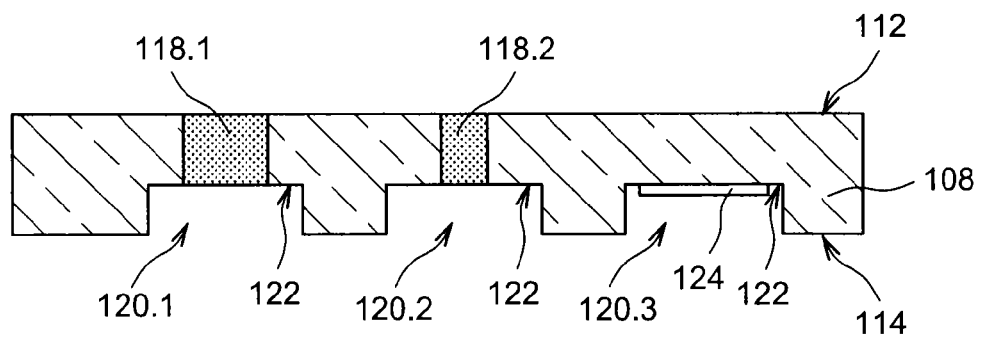

The semiconductor oxide located outside the openings 110 is then eliminated, for example by chemical-mechanical planarization with stop on the first face 112 of the second substrate 108 (see FIG. 5C).

The cap substrate 106 is then completed in the same manner as in the previous example embodiment of the cap substrate 106, in other words by etching the cavities 120 through the second face 114 of the second substrate 108, until reaching the other face 122 of the second substrate 108 (see FIG. 5D), and possibly depositing a getter material in the cavity(ies) in which gas absorption is required.

Figure 6A:
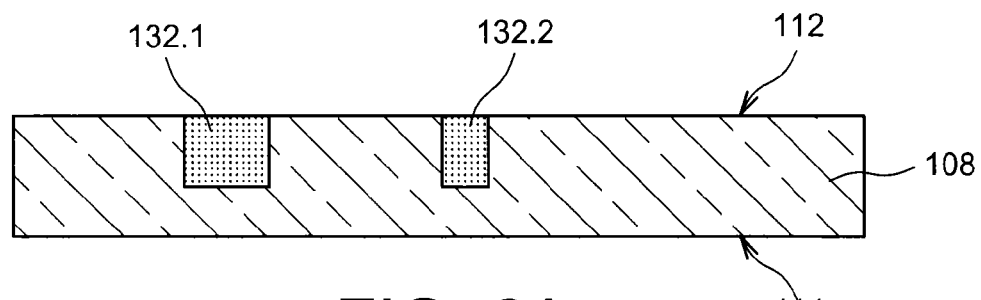
Figure 6B:
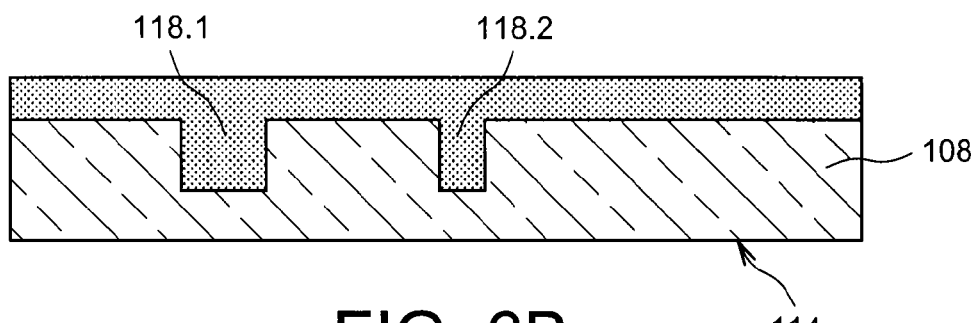

A second variant embodiment of the cap substrate 106 is disclosed with reference to FIGS. 6A and 6B.

As before, the second substrate 108 is used. The next step is to make portions of porous semiconductor 132 (referenced 132.1 and 132.2 in FIG. 6A) at the locations of the portions of the first material 118. For example, the thickness of these porous semiconductor portions 132 may be between about 10 μm and 200 μm. These portions of porous semiconductor 132 may for example be made by HF etching under a current such as an anodisation.

As described previously with reference to FIG. 5B, an oxidation step such as thermal oxidation is then carried out in order to transform the porous portions 132 into oxide portions 118 (FIG. 6B). The cap substrate 106 is then completed by the steps previously disclosed with reference to FIGS. 5C and 5D.

In the examples disclosed above, the cavities 120 are made by etching the second substrate 108. As a variant, it is possible that the cavities 120 are formed in the first substrate 104, the microelectronic devices 102 being located above these cavities. In this case, the step to produce cavities 120 in the second substrate 108 is replaced by a step to thin the entire second substrate 108 from the second face 114 (for example by grinding or chemical-mechanical planarization), until reaching the other face 122 and thus expose portions 118 made in the second substrate 108.

In another variant, the side walls of the cavities 120 can be formed by portions of material distinct from the first substrate 104 and the second substrate 108. In this case, the step to thin the second substrate 108 from the second face 114 is also done.

According to one variant embodiment, the first material of portions 118 may be a semiconductor nitride, for example SiN or $Si_3N_4$.

According to another variant, the getter material(s) arranged in one or several cavities may be arranged at any wall in this or these cavities, but not on the walls formed by the portions 118.

The invention claimed is:

1. A process for encapsulating at least one microelectronic device, comprising at least the following steps:
    make the microelectronic device on a first substrate;
    make at least one portion of a first material not permeable to the ambient atmosphere and permeable to at least one noble gas in a second substrate not permeable to the ambient atmosphere and to the noble gas, said portion of the first material extending from a first face of the second substrate as far as another face of the second substrate opposite the first face;
    secure the second substrate to the first substrate, forming at least one cavity inside which the microelectronic device is encapsulated such that said portion of the first material forms at least part of a wall of the cavity;
    inject the noble gas into the cavity through the portion of the first material;
    hermetically seal the cavity towards the ambient atmosphere and the noble gas;
    the gas or gases of the ambient atmosphere being different from the noble gas.

2. The process according to claim 1, in which production of the portion of the first material includes the following steps:
    produce at least one opening in a part of the thickness of the second substrate through the first face of the second substrate;
    make the portion of the first material in the opening;
    eliminate part of the second substrate from a second face of the second substrate opposite the first face, exposing the portion of the first material and forming said other face of the second substrate.

3. The process according to claim 2, in which the first material includes glass or semiconducting oxide.

4. The process according to claim 3, in which the first material includes glass and the making of the portion of the first material in the opening includes the following steps:
    secure a third glass substrate in contact with the first face of the second substrate and facing the opening;
    remelt the glass of at least part of the third substrate in the opening, forming the portion of the first material in the opening.

5. The process according to claim 4, also comprising a step to eliminate the glass of the third substrate located outside the opening, after the glass remelting step.

6. The process according to claim 3, in which the second substrate comprises a semiconductor, and in which production of the opening includes etching in said part of the thickness of the second substrate such that the remaining portions of the semiconductor of the second substrate remain in the opening, the making of the portion of the first material in the opening including oxidation of said remaining portions of the semiconductor.

7. The process according to claim 1, in which the second substrate includes a semiconductor, and the making of the portion of the first material includes the following steps:
    produce porosities in part of the thickness of the second substrate through the first face of the second substrate;

oxidise the porous part of the second substrate, forming the portion of the first material;

eliminate part of the second substrate from a second face of the second substrate opposite the first face face, exposing the portion of the first material and forming said other face of the second substrate.

8. The process according to claim 6, also including a step to eliminate the semiconductor oxide located outside the opening after the oxidation step and when the oxidation applied forms the semiconductor oxide outside the opening.

9. The process according to claim 7, also including a step to eliminate the semiconductor oxide located outside the opening after the oxidation step and when the oxidation applied forms the semiconductor oxide outside the opening.

10. The process according to claim 1, in which hermetic sealing of the cavity towards the ambient atmosphere and the noble gas include the deposition of at least one second material not permeable to the noble gas at least in contact with said portion of the first material, at the first face of the second substrate.

11. The process according to claim 1, in which the steps which are carried out include encapsulation of at least two microelectronic devices in at least two distinct cavities formed between the first substrate and the second substrate, such that at least one portion of the first material forms at least part of a wall of one of the cavities.

12. The process according to claim 11, in which the steps which are carried out make at least two portions of the first material each forming at least part of a wall of one of the two cavities.

13. The process according to claim 12, in which said at least two portions of the first material have different dimensions at at least one of the first face of the second substrate and the other face of the second substrate.

14. The process according to claim 11, in which at least one of the microelectronic devices is encapsulated in one of the cavities such that no wall of said one of the cavities is permeable to the noble gas.

15. The process according to claim 1, also including production of at least one portion of getter material in one or several cavities, before the step in which the second substrate is secured to the first substrate.

16. The process according to claim 14, in which the microelectronic device encapsulated in the cavity of which no wall is permeable to the noble gas is a gyroscope, and at least the other of the microelectronic devices is an accelerometer.

17. The process according to claim 1, in which the noble gas includes at least one of helium, argon and neon.

18. The process according to claim 1, wherein the step to inject a noble gas into the cavity through the portion of the first material is carried out by exposing at least the first face of the second substrate to the noble gas at a pressure of between about 1 bar and 6 bars.

* * * * *